(12) United States Patent
Shaikevitch et al.

(10) Patent No.: US 8,182,112 B2
(45) Date of Patent: May 22, 2012

(54) REFLECTIVE SURFACE SUB-ASSEMBLY FOR A LIGHT-EMITTING DEVICE

(75) Inventors: Alexander Shaikevitch, Pleasanton, CA (US); Rene Helbing, Palo Alto, CA (US)

(73) Assignee: Bridgelux, Inc., Livermore, CA (US)

( * ) Notice: Subject to any disclaimer, the term of this patent is extended or adjusted under 35 U.S.C. 154(b) by 73 days.

(21) Appl. No.: 12/861,580

(22) Filed: Aug. 23, 2010

(65) Prior Publication Data

US 2010/0315818 A1    Dec. 16, 2010

Related U.S. Application Data

(60) Provisional application No. 61/278,575, filed on Oct. 7, 2009.

(51) Int. Cl.
*F21V 33/00* (2006.01)
(52) U.S. Cl. .................................................. 362/249.02
(58) Field of Classification Search .............. 362/249.02
See application file for complete search history.

(56) References Cited

U.S. PATENT DOCUMENTS

| | | | |
|---|---|---|---|
| 7,942,556 B2 * | 5/2011 | Harbers et al. | 362/294 |
| 8,021,033 B2 | 9/2011 | Tokita et al. | |
| 2008/0084699 A1 * | 4/2008 | Park et al. | 362/373 |
| 2009/0091919 A1 * | 4/2009 | Goto | 362/97.1 |
| 2009/0152573 A1 * | 6/2009 | Loh et al. | 257/89 |
| 2009/0322208 A1 | 12/2009 | Shaikevitch et al. | |
| 2010/0164362 A1 | 7/2010 | Miyakawa et al. | |
| 2010/0165624 A1 * | 7/2010 | Ogawa et al. | 362/235 |

* cited by examiner

*Primary Examiner* — Laura Tso
(74) *Attorney, Agent, or Firm* — Pavel Kalousek

(57) ABSTRACT

A reflective surface sub-assembly for a light-emitting device, comprising a substrate, at least one area reserved for placement of a light-emitting device assembly on the substrate, and a diffusive reflective layer applied on selected regions on the substrate, wherein if the light-emitting device assembly were placed onto the at least one area then the diffusive reflective layer would reflect photons emitted by the light-emitting device assembly is disclosed.

15 Claims, 4 Drawing Sheets

REFLECTIVE SURFACE SUB-ASSEMBLY FOR A LIGHT-EMITTING DEVICE

CROSS-REFERENCE TO RELATED APPLICATION

Pursuant to 35 U.S.C. §119(e), this application claims the benefit of U.S. Provisional Application Ser. No. 61/278,575 filed on Oct. 7, 2009, the contents of which is herby incorporated by reference in its entirety. This application is further related to U.S. application Ser. No. 12/861,641, filed on Aug. 23, 2010, titled "Method for Manufacturing A Reflective Surface Sub-Assembly For A Light-Emitting Device."

BACKGROUND

1. Field

The present disclosure relates to a light-emitting device, examples of which are a light-emitting diode (LED) and a laser diode (LD), and more particularly, to a reflective surface sub-assembly for such a device.

2. Description of Related Technology

Without any loss of generality, merely to avoid undue repetitiveness of the disclosure, the state of related technology is explained using an LED as a typical example of a light-emitting device.

The principle of operation of LEDs is based on a property of a semiconductor p-n junction. When a p-n junction is forward biased, i.e., a positive voltage is applied on the p-type semiconductor and a negative voltage is applied on the n-type semiconductor, charge carriers—electrons and holes—flow into the junction. When an electron collides with a hole, the electron recombines with the hole and because the electron falls into a lower energy level, the excess energy—equal to the difference between the electron and hole energy levels involved—is released in the form of a photon. This effect is called electroluminescence and the color of the light is determined by the energy gap of the semiconductor.

Because the collision between the electron and the hole is statistical in nature, the photons will be emitted from the p-n junction in random directions. To improve light extraction from the p-n junction of the light-emitting device, a layer of reflective material is applied to surfaces that are transparent to the emitted wavelength or have poor reflectivity of the emitted wavelength in an undesirable direction of emission. Reflectivity is characterized by a ratio of reflected to incident light. To achieve the best possible luminous efficiency, material with high reflectivity, e.g., noble metals like Pt, Au, Ag, or other materials, like Al, are used for this purpose. However, use of some of the materials, e.g., Pt, Au, both from the cost of the materials and the process of applying the materials to the surfaces, are relatively expensive. Other materials, e.g., Al, although relatively inexpensive, require expensive polishing and always oxides in an oxygen present environment. However, even after extensive—and expensive—polishing Al's reflective power is inferior to polished Ag. Additionally, although polishing increases total reflectivity, it does so by increasing specular reflectivity. However, as discussed in greater detail below, the material should possess diffusive rather than specular reflectivity. Ag, preferable to Al due to its superior reflectivity, is prone to oxidation and/or tarnishing, especially when the Ag surface comes in contact with some of the chemicals used in light-emitting device manufacturing process. An example of such would be the use of phosphors for light conversion in LEDs. Furthermore, Ag coated substrates require utter moisture protection, which increases the overall cost of an LED package, yet not always results in the desired level of performance and/or stability, i.e., resistance to change of parameters over time, of the device. For example, although all appropriate precautions have been taken during the manufacturing process, due to the fact that a case of the light-emitting device is not hermetically sealed against the environment in which the light-emitting apparatus is deployed, oxidation may happen over time, thus causing deterioration of a reflectivity, uniformity of the light and other parameters over time.

Accordingly, there is a need in the art for improvements in light-emitting devices to increase light output, simplify manufacturing process, decrease cost, and provide additional advantages evident to a person skilled in the art.

SUMMARY

In one aspect of the disclosure, a reflective surface sub-assembly for light-emitting device according to appended independent claims is disclosed. Preferred additional aspects are disclosed in the dependent claims.

BRIEF DESCRIPTION OF THE DRAWINGS

The foregoing aspects described herein will become more readily apparent by reference to the following description when taken in conjunction with the accompanying drawings wherein.

DETAILED DESCRIPTION

Figure 1A:
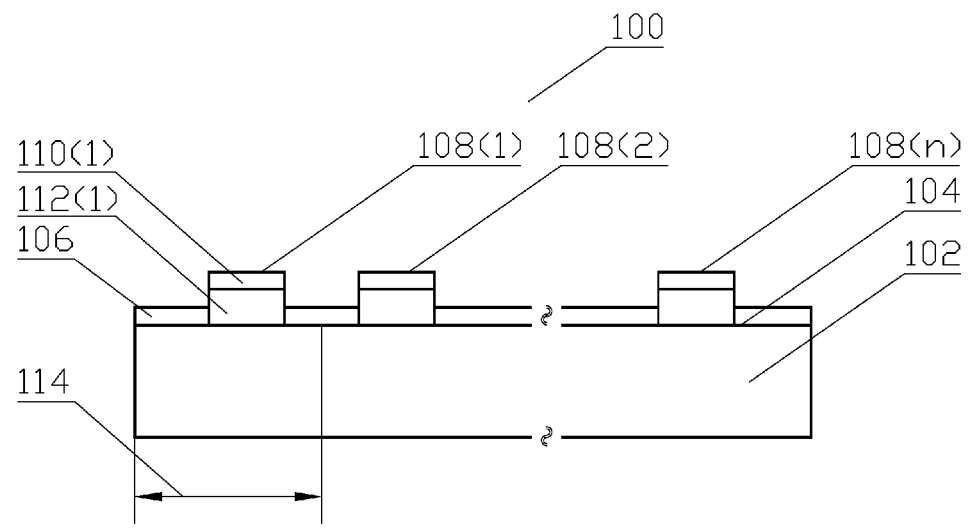
FIG. 1 depicts a conceptual cross section of an exemplary light-emitting device in accordance with an aspect of this disclosure.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

FIG. 1(a) depicts a conceptual cross section of an exemplary reflective surface sub-assembly 100 for a light-emitting device in accordance with an aspect of this disclosure. A substantially flat substrate 102 in addition to being a mechanical support is often used as a means for heat dissipation from the light-emitting device. When used in the latter function the substrate 102 is made from a material with high thermal conductivity. Such material may comprise metals, e.g., Al, Cu, Si-based materials, or any other material whose thermal conductivity is appropriate for the light-emitting device in question. A person skilled in the art will appreciate that material appropriate for a light-emitting device with power dissipation of, e.g., 35 milliwatts (mW) is different than material appropriate for a light-emitting device with power dissipation of, e.g., 350 mW. Flatness is understood to be different than roughness in the sense that flatness describes irregularities whose spacing is greater than the roughness sampling length. A material is considered to be substantially flat if the irregularities in flatness would not cause light to be reflected by such irregularities.

An upper face 104 of the substrate 102 does not need to be treated, e.g., by polishing, buffing, or any other process, to acquire any specific reflectivity. Instead, the desired reflectivity is achieved by applying a layer 106 of a material with high reflectivity onto select region(s) of the upper face 104. This concept is clarified in reference to FIG. 2. The description of like elements between FIG. 1 and FIG. 2 is not repeated, the like elements have reference numerals differing by 100, i.e., reference numeral 102 of FIG. 1 becomes reference numeral 202 in FIG. 2.

Figure 2:
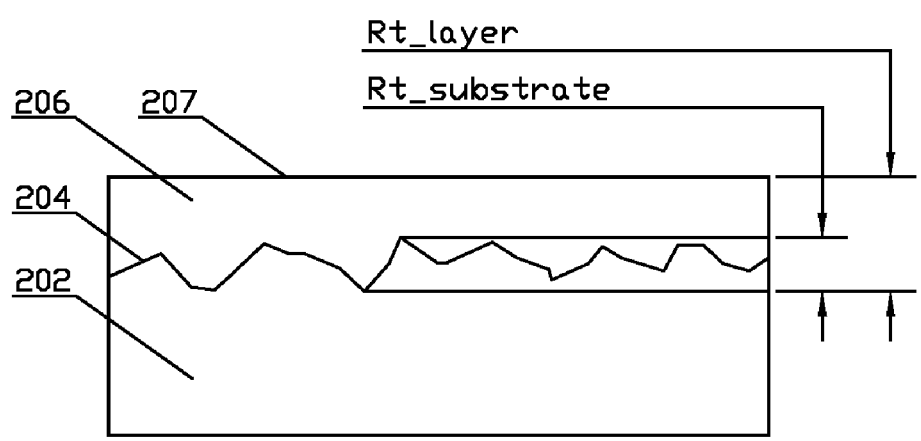
FIG. 2 depicts a conceptual cross section of a substrate with a diffusive reflective layer applied on the substrate.

Referring to FIG. 2, the upper face 204 of the substrate 202 is depicted with roughness characterized by a parameter $R_{t\_substrate}$. $R_{t\_substrate}$ is a difference between the height of the highest peak and the depth of the deepest valley in the upper face 204. The layer 206, applied directly on the upper face 204 of the substrate 202, is depicted with an upper face 207. The variable thickness of the layer 206 is characterized by a parameter $R_{t\_layer}$. $R_{t\_layer}$ is a difference between the upper face 207 and the depth of the deepest valley in the upper face 204. As long as $R_{t\_layer} \leq R_{t\_substrate}$, the layer 206 fills the irregularities in the upper face 204. In other words, the material of the layer 206 builds up the substrate 202 to the level 207 of the upper face 204. Consequently, the substrate 202 has no effect on the reflectivity, which is determined solely by the composition of the layer 206. A person skilled in the art will appreciate that although the layer 206 is applied directly on the upper face 204 of the substrate 202, an additional thin layer of constant thickness (not shown) essentially copying, therefore, not altering, the roughness of the upper face 204, can be can be applied as disclosed in greater details below.

It is well known to person skilled in the art that an expense of fabrication increases with decreased surface roughness, an appropriate choice of material for layer 206 and/or technology for application of layer 206 directly on the upper face 204 of the substrate 202 will affect the required roughness. In one aspect the upper face 204 roughness is between 0.05 and 5 microns.

Referring back to FIG. 1(a), a material is considered to be of high reflectivity, if a total reflectivity of the resulting layer 106 is greater than or equal to 75%. As discussed in greater detail below, the material for the layer 106 should also possess diffusive rather than specular reflectivity. Out of the at least 75% total reflectivity, at least 50% should be diffusive reflectivity. Of course, the higher the percentage of diffusive reflectivity, the better the luminous efficiency; thus materials with 70% of total reflectivity, or nearly 100% total reflectivity are preferable. Additional desirable properties of the material for layer 106 would be, e.g., non-oxidative surface, low cost, and ease of application on the substrate.

The region(s), to which the layer 106 is applied, are selected in accordance with determined placement of light-emitting device assembly(ies) 108 on the substrate 102, so that the photons emitted form the light-emitting device assembly(ies) 108 in undesirable directions are reflected from the layer 106. The placement of the light-emitting device assembly(ies) 108 is a design choice depending on multiple considerations, e.g., type of light-emitting device assembly, number and arrangement of the light-emitting device assembly(ies), thermal conductivity of the material 106, and other considerations known to a person skilled in the art.

Accordingly, FIG. 1(a) depicts a design in which the selected region(s) do not include the region(s) that were determined to be occupied by the light-emitting device assemblies 108 during the design. Although FIG. 1(a) depicts a plurality of n light-emitting device assemblies 108(1)-108(n), the disclosure is equally applicable to a single light-emitting device assembly 108, i.e., considering only the part of FIG. 1 delimited by an arrow 114.

As depicted, each light-emitting device assembly 108 comprises a light-emitting device chip 110 with a layer 112 of material with high reflectivity on the bottom of light-emitting device chip 110. In order to avoid unnecessarily cluttering of FIG. 1, only the first light-emitting device assembly 108(1) is depicted with the reference numerals 110(1) and 112(1). Such a light-emitting device assembly 108 is commercially available for high power light-emitting devices, in which the layer 112 further provides a heat-sinking capability. Consequently, the layer 112 accomplishes the function of layer 106 for reflecting those photons that are emitted with the direction towards the bottom of the light-emitting device chip 110, as well as providing low thermal resistance to the substrate 102.

Although in principle the layer 106 could be also applied on the region occupied by the light-emitting device assembly 108, this might increase the thermal resistance between the light-emitting device assembly 108 and the substrate 102. A person skilled in the art will understand that the material comprising the layer 112 may, but need not be identical to the material comprising the layer 106.

Figure 1B:
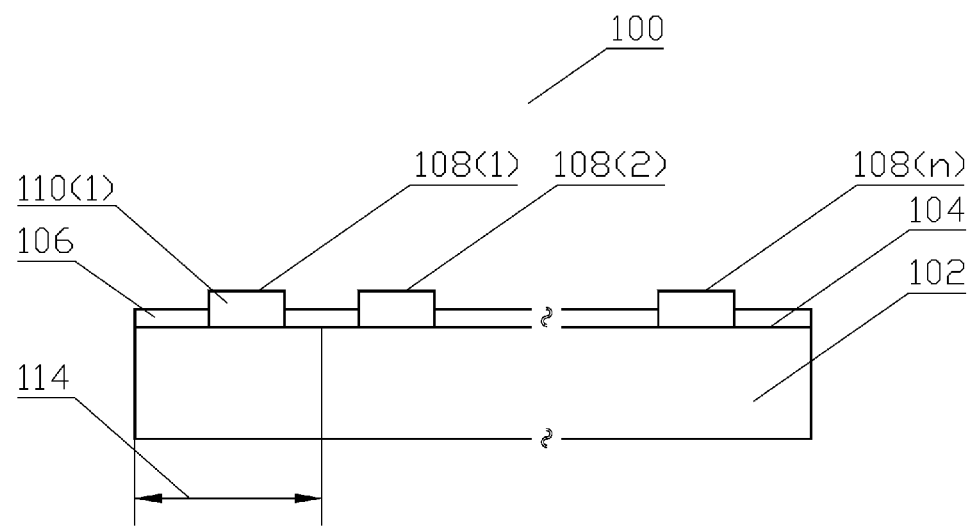

In contrast, some lower power light-emitting device assemblies omit the layer 112, thus comprising only the light-emitting device chip 110. Because, as disclosed above, the substrate 102 is not treated to acquire any specific reflectivity, loss of luminous efficiency due to absorption of photons emitted with the direction towards the bottom of the light-emitting device assembly may result. FIG. 1(b) depicts a conceptual cross section of an exemplary reflective surface sub-assembly 100 for a light-emitting device in accordance with such an aspect of this disclosure. Should the potential loss of luminous reflectivity be unacceptable, the layer of the material 106 can be applied also on the region occupied by the light-emitting device chip 110 (not shown in FIG. 1). Although such a design may increase the thermal resistance between the light-emitting device assembly 108 and the substrate 102, due to the low power of the light-emitting device, the design may be preferable to an alternative, i.e., placing the light-emitting device assembly 108 on the substrate and treating the substrate 102 under the light-emitting device chip 110 to provide a specific reflectivity.

The desirability of the diffusive property of the material with high reflectivity used for layer 106 will now be described in reference to FIG. 3. The description of like elements between FIG. 1 and FIG. 3 is not repeated, the like elements have reference numerals differing by multiple of 100, i.e., reference numeral 102 of FIG. 1 becomes reference numeral 302 in FIG. 3.

Figure 3A:
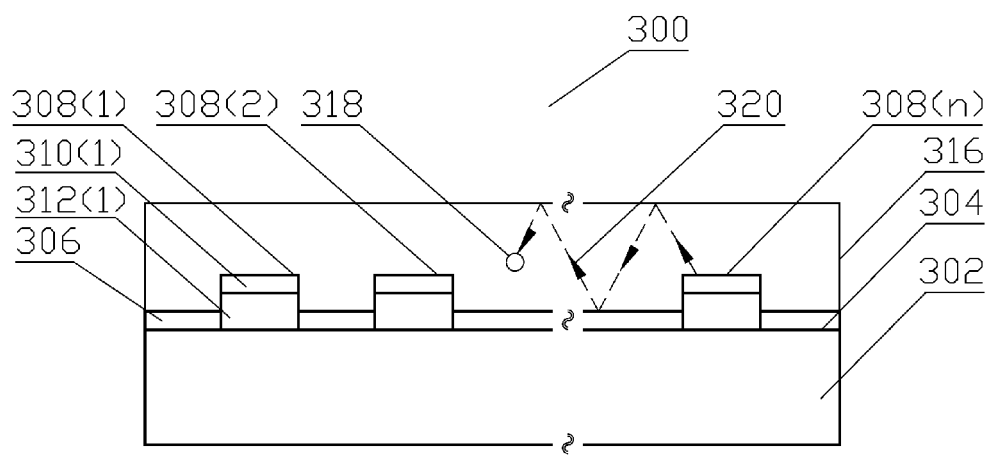
FIG. 3 depicts a conceptual cross section of an exemplary light-emitting device in accordance with another aspect of this disclosure.

Referring now to FIG. 3(a), a reflective surface sub-assembly 300 for a light-emitting device further comprises a case 316. The case 316 serves as means for protection from surrounding environment and may, optionally, also serve as means for focusing or diffusing the emitted photons in desired direction. A photon 318 emitted from the light-emitting device assembly 308(n) propagates along the path depicted by broken line arrow 320 through the medium characterized by a refraction index $n_1$ and reaches the case 316 made from material characterized by a refraction index $n_2$. The difference in the refraction indexes $n_1$, $n_2$ creates a reflective interface. Depending on the refraction indexes $n_1$, $n_2$ and the angle of arrival of the photon 318 with respect to a normal to the case 316 may cause the photon 318 to be reflected from the case 316. The reflected photon 318 then propagates back and reaches the layer 106 made from material characterized by a refraction index $n_3$. As such the difference in the refraction indexes $n_1$, $n_3$ creates a reflective interface and, if the layer 306 were specularly reflective, following the law of reflection, reflects with the angle of reflection equal to the angle of incidence towards the case 316. This behavior may be repeated until the energy of the photon 318 is lost.

Figure 3B:
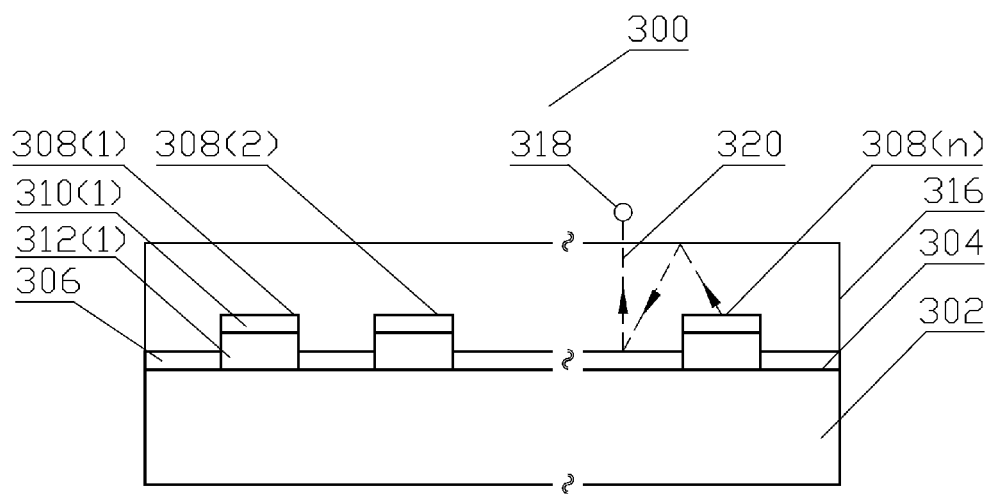

The above-described mechanism changes with the layer of the material 306 being diffusively reflective, as depicted in FIG. 3(b). Because of the granular or uneven surface of the diffusively reflective layer of the material 306, the photon 318 may be reflected under a different angle, and, consequently, not be reflected back when the photon 318 reaches the case 316 because the incident angle with the case 316 has been altered.

Referring to FIG. 1 and FIG. 3 the layer 106 (306) is depicted as abutting the light-emitting device assembly 108 (308), i.e., the area not covered by the layer 106 (306) is equivalent to the area of the light-emitting device assembly 108 (308). A person skilled in the art will understand that the terms "abutting" and "equivalent" are to be interpreted in a technical rather than a strict literal meaning, i.e., the fit between the layer 106 (306) and the light-emitting device assembly 108 (308) will not have zero tolerance. However, such a non-zero tolerance will cause only negligible decrease in light extraction due to some photons generated by the light-emitting device chip 110 (310) being emitted in a direction allowing the photons to reach and be reflected by the upper face 104 (304) of the substrate 102 (302) rather than the layer 106 (306). Nevertheless, achieving such a fit may be difficult and/or expensive in a production environment. Consequently, FIG. 4 depicts an alternative arrangement. The description of like elements between FIG. 1, FIG. 2 and FIG. 4 is not repeated; the like elements have reference numerals differing by multiples of 100.

Figure 4A:
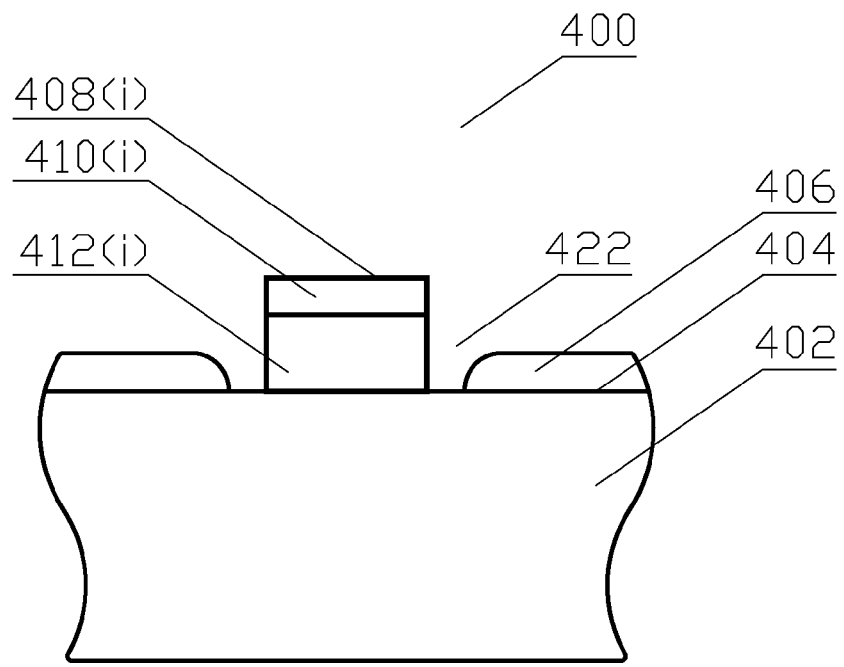
FIG. 4 depicts details of an area around a light-emitting device assembly, i.e., reflective layer creating a cavity.

Considering FIG. 4(a), the requirement on the fit between the layer 406 and the light-emitting device assembly 408 have been relaxed. Rather than abutting, the layer 406 extends to proximity what would be a typical dimension of the light-emitting device assembly 408, creating a cavity 422. Consequently, a non-negligible decrease of luminous efficiency will be caused due to some photons being emitted by the light-emitting device chip 410 in the direction allowing them to reach the bottom of the cavity 422, and be thus reflected by the upper face 404 of the substrate 402 rather than the layer 406. The decreased luminous efficiency may be mitigated by other measures, e.g., polishing the upper face 404 of the substrate 402 in at least the cavity, or by an alternative aspect as depicted in FIG. 4(b).

Figure 4B:
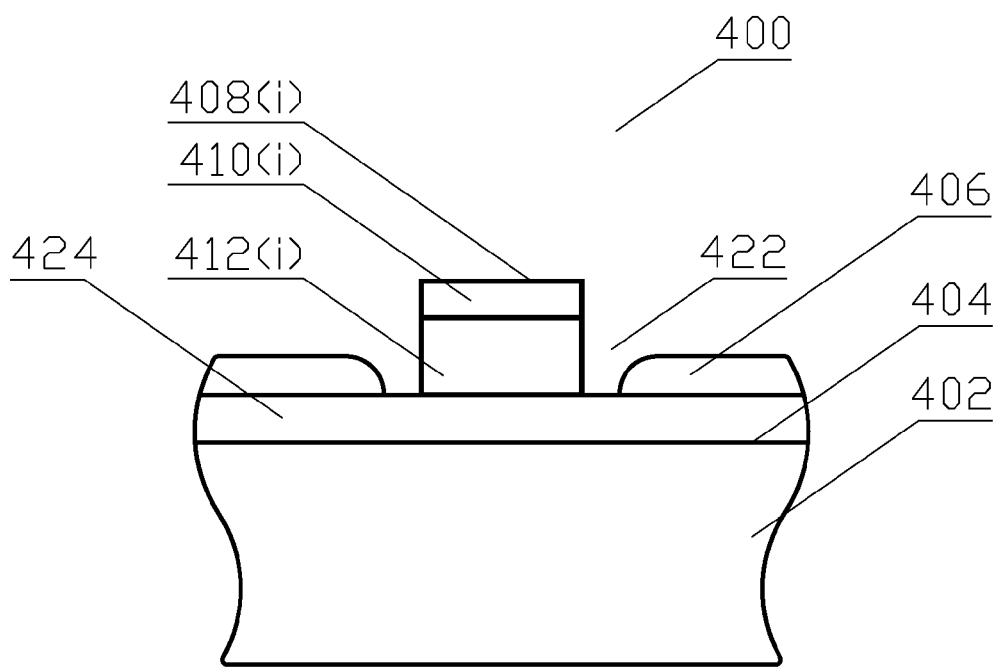

FIG. 4(b) differs from FIG. 4(a) in that an additional layer 424 of reflective material is added on the upper face 404 of the substrate 402 to further improve light extraction by improving reflection of the photons reaching the bottom of the cavity 422. As discussed above, the additional layer 424 has constant thickness, thus essentially copying, therefore, not altering, the roughness of the upper face 404. Such reflective material may be, for example, any of the above-mentioned noble metals. As depicted in FIG. 4(b), the layer 424 extends under the entire area occupied by the light-emitting device assemblies 408. Consequently, it is possible that the light-emitting device assemblies 408 may comprise only the light-emitting device chip 410 since the function of the layer 412 is provided by the layer 424. In an alternative (not shown), the layer 424 may abut the area occupied by the light-emitting device assemblies 408, which should comprise both the light-emitting device chip 410 and the layer 412.

A person skilled in the art will understand that what comprises a negligible decrease in light extraction is dependent on an application. Thus, for example, for an LED intended for application indication states "on" (LED emitting light) and "off" (LED not emitting light) several percent or perhaps even tens of percent of decrease in light extraction are negligible. On the other hand, for an LED intended for application in lighting, only units of percent or perhaps even less may be considered negligible.

Although as understood, any highly reflective material with diffuse reflection satisfying the disclosed parameters may be used, the inventors discovered that good results were achieved with titanium oxide or other oxide phases or compositions such as $TiO_2$, $Ti_2O_3$, and the like. The improvement of luminous efficiency over that of related technologies using noble metal based coating was by 5 to 25%, depending on specificity of the substrate/light-emitting device assembly geometry, even though titanium oxide is known to have specular reflectivity inferior to the specular reflectivity of the above mentioned noble metals. This further confirms the importance of diffusive reflectivity inherent in, e.g., the above-mentioned titanium oxide or other oxide phases or compositions such as $TiO_2$, $Ti_2O_3$, and the like. The diffusive reflectivity is provided by the random orientation of the crystals of the titanium oxide or other oxide phases or compositions such as $TiO_2$, $Ti_2O_3$, and the like. In addition to high total and diffusive reflectivity, titanium oxide or other oxide phases or compositions as utilized according to this disclosure possesses many of the properties desirable for material for layer 106, i.e., non-oxidative surface, diffusive reflection, relatively low cost, and the like.

Referring back to FIG. 1, different methods may be used for applying layer 106 directly on the substrate 102, e.g., dispersing, brushing, and the like. However, screen-printing, which utilize well known thick film technology has been found to be effective especially with regards to layer 106 being titanium dioxide. Consequently, for the purposes of simplicity, the manufacturing process will be described in regards to the titanium dioxide. However, a person skilled in the art would understand that the manufacturing process is equally applicable to other materials, which could comprise layer 106, in accordance with concepts disclosed herein. A person skilled in the art would further understand that the term "thick-film" refers to a particular technology and is not restricted to any particular thickness for each layer.

After the design of the light-emitting apparatus has been finished, a substrate 102 is manufactured from the appropriate material. A stencil or a screen is then prepared with selected regions for a transfer of a curable titanium dioxide paste, which after curing will create the layer 106, directly on the chosen substrate 102. Good results have been achieved with a titanium dioxide paste composition comprising polymer matrix, titanium dioxide filler, and additional rheological additives which adjust rheological properties of the paste. The additional rheological additives comprise, e.g., silica, alumna, zinc oxide, magnesium oxide, talc, and other additives known to a person skilled in the art, used either individually or in combination. The constituting composition elements, e.g., choice of polymer, particle sizes, loading level and the like, need to be optimized to assure that the rheology of the paste follows pseudo-plastic behavior.

Based on the foregoing requirement, in one aspect, the polymer matrix may comprise any curable silicone ensuring a good bond of the titanium dioxide paste with the surface of the chosen substrate 102. Preferably, polymers that possess hydride, hydroxyl or other reactive functionalities are selected for their superior bonding characteristics. The titanium dioxide filler may comprise particles with average size between 100 nm to 20 microns, and the loading level may be between 10% to 75%, depending on specific surface area of the titanium dioxide particles. The particle sizes and loading levels of the rheological additives are selected to appropriately adjust the rheological properties as disclosed above. Thus, by means of an example, the silica, e.g., untreated fumed silica, may comprise particles with average size of tenths of microns, and the loading level from 0% to 4%, combined with the alumna, e.g., fumed alumina, with a loading level from 0.1% to 2%.

Once the titanium dioxide paste is prepared according to the disclosed guidelines, the titanium dioxide paste is transferred onto the screen of the screen printer and screen printing proceeds according to methodology known in the art. Thus a conventional screen printer may be used to screen-print the titanium dioxide paste onto the chosen substrate. Upon transfer of the titanium dioxide paste on the substrate, the temperature is kept at room temperature for a first interval. In one aspect the first interval is 20 minutes. The substrate with the titanium dioxide paste thereon is then placed into an oven for pre-curing during a second interval. In one aspect the oven temperature is then raised to 110° C. during the second interval. In one aspect the second interval is one to two hours. The temperature is then raised and the titanium dioxide paste is cured at this third temperature for a third time interval. In one aspect the third temperature is approximately 150° C. and the third time interval is between 2-4 hours depending on the composition of the paste.

The various aspects of this disclosure are provided to enable one of ordinary skill in the art to practice the present invention. Modifications to various aspects of a presented throughout this disclosure will be readily apparent to those skilled in the art, and the concepts disclosed herein may be extended to other applications. Thus, the claims are not intended to be limited to the various aspects of the reflective surfaces for a light-emitting device presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A reflective surface sub-assembly for a light-emitting device, comprising:
    a substrate;
    at least one area reserved for placement of a light-emitting device assembly on the substrate; and
    a diffusive reflective layer applied on selected regions on the substrate as a paste comprising a polymer matrix,
a titanium oxide or other oxide phases or compositions filler, and
a rheological additive comprising a silica and an alumna; wherein
upon placing the light-emitting device assembly onto the at least one area then the diffusive reflective layer would reflect photons emitted by the light-emitting device assembly.

2. The apparatus according to claim 1, wherein the substrate is substantially flat.

3. The apparatus according to claim 1, wherein the diffusive reflective layer is characterized by at least 50% diffusive reflectivity.

4. The apparatus according to claim 1, wherein the diffusive reflective layer is characterized by at least 70% diffusive reflectivity.

5. The apparatus according to claim 1, wherein the reflective layer fills irregularities in a face of the substrate.

6. The apparatus according to claim 1, wherein the diffusive reflective layer comprises titanium oxide or other oxide phases or compositions.

7. The apparatus according to claim 1, wherein the diffusive reflective layer comprises titanium dioxide.

8. The apparatus according to claim 1, wherein the loading levels of the paste's composition comprise:
the titanium oxide or other oxide phases or compositions filler in an amount of 10%-75%,
the silica in an amount of 0%-4%, and
the alumna in an amount of 0.1-2%.

9. The apparatus according to claim 8, wherein the titanium oxide or other oxide phases or compositions filler comprises titanium dioxide filler.

10. The apparatus according to claim 1, wherein the selected regions on the substrate exclude the at least one area reserved for placement of a light-emitting device assembly.

11. The apparatus according to claim 1, wherein the selected regions on the substrate include the at least one area reserved for placement of a light-emitting device assembly.

12. The apparatus according to claim 1, wherein the at least one area reserved for placement of the light-emitting device assembly is equivalent to the area of the light-emitting device assembly to be placed on the at least one area reserved for placement.

13. The apparatus according to claim 1, wherein the at least one area reserved for placement of the light-emitting device assembly is greater than the area of the light-emitting device assembly to be placed on the at least one area reserved for placement.

14. The apparatus according to claim 1, further comprising a light-emitting device assembly placed on the at least one area reserved for placement of the light-emitting device assembly.

15. A light emitting device assembly, comprising the reflective surface sub-assembly of claim 1, and a semiconductor light emitting device.

* * * * *